United States Patent
Bychkov et al.

(10) Patent No.: US 7,512,847 B2
(45) Date of Patent: Mar. 31, 2009

(54) METHOD FOR ESTIMATING AND REPORTING THE LIFE EXPECTANCY OF FLASH-DISK MEMORY

(75) Inventors: Eyal Bychkov, Hod Hasharon (IL); Avraham Meir, Rishon Lezion (IL); Alon Ziegler, Ramat Gan (IL); Itzhak Pomerantz, Kefar Saba (IL)

(73) Assignee: Sandisk IL Ltd., Kfar Saba (IL)

( * ) Notice: Subject to any disclaimer, the term of this patent is extended or adjusted under 35 U.S.C. 154(b) by 85 days.

(21) Appl. No.: 11/702,500

(22) Filed: Feb. 6, 2007

(65) Prior Publication Data

US 2007/0198786 A1 Aug. 23, 2007

Related U.S. Application Data

(60) Provisional application No. 60/771,786, filed on Feb. 10, 2006.

(51) Int. Cl.
*G11C 29/00* (2006.01)

(52) U.S. Cl. .............................. 714/723; 714/5; 714/25; 714/42; 714/47; 714/48; 714/718; 714/719; 714/721; 714/742; 714/745; 365/200; 365/201; 365/185.29; 365/185.33; 365/185.01; 365/185.22; 711/103; 711/154; 711/171; 711/115; 711/5; 711/202

(58) Field of Classification Search ........................ None
See application file for complete search history.

(56) References Cited

U.S. PATENT DOCUMENTS

| | | | |
|---|---|---|---|
| 5,404,485 A | | 4/1995 | Ban |
| 5,537,357 A | * | 7/1996 | Merchant et al. ............ 365/218 |
| 5,959,891 A | * | 9/1999 | Sansbury ............... 365/185.24 |
| 6,119,245 A | * | 9/2000 | Hiratsuka ...................... 714/7 |
| 6,948,102 B2 | * | 9/2005 | Smith .......................... 714/47 |
| 7,277,336 B2 | * | 10/2007 | Ilkbahar et al. ............. 365/200 |
| 2003/0023911 A1 | * | 1/2003 | Davis et al. ................. 714/723 |
| 2004/0088614 A1 | * | 5/2004 | Wu ............................. 714/718 |
| 2006/0236165 A1 | * | 10/2006 | Cepulis et al. .............. 714/721 |
| 2007/0067678 A1 | * | 3/2007 | Hosek et al. .................. 714/25 |
| 2007/0150689 A1 | * | 6/2007 | Pandit et al. ................ 711/170 |
| 2007/0180328 A1 | * | 8/2007 | Cornwell et al. ............. 714/42 |

* cited by examiner

*Primary Examiner*—John P Trimmings
(74) *Attorney, Agent, or Firm*—Mark M. Friedman

(57) ABSTRACT

A method for managing a memory device, a memory device so managed and a system that includes such a memory device. A value of a longevity parameter of the device is monitored after a data operation on the device in which the monitoring is performed by the device. A grade of the device is derived from the value. Preferred longevity parameters include a ratio of successfully-processed data to unsuccessfully-processed data and a deviation in a power consumption of the device. The grade serves as a forecast of a life expectancy of the memory. Preferred grades include: a comparison grade, a maximum grade, and an average grade.

34 Claims, 6 Drawing Sheets

Prior Art

| Information data 74 | ECC 72 |

| Information data 74 | ECC 72 | Grade 78 |

⏟ 76

Figure 4B

METHOD FOR ESTIMATING AND REPORTING THE LIFE EXPECTANCY OF FLASH-DISK MEMORY

This patent application claims the benefit of U.S. Provisional Patent Application No. 60/771,786 filed Feb. 10, 2006.

FIELD AND BACKGROUND OF THE INVENTION

The present invention relates to methods for built-in detection of the deterioration of reliability in digital memory devices in general, and in removable flash-memory devices in particular.

Digital memory devices are often used as dependable memory devices for important data. As a result of the limited life expectancy and complexity of such equipment, digital memory devices can fail, and cause the loss of valuable data. Non-volatile storage systems include a memory and a control system, which sometimes reside on the same piece of silicon. One of the tasks performed by the control system is error correction.

Error-correction code (ECC) detects occasional errors in the data, generated by the storage element's nature or the characteristics of the operating environment, fixes the error, and delivers the corrected original information upon a user's request. The ECC system has a built-in limitation with regard to the number of errors that can be corrected. Upon encountering an excessive number of errors, the information cannot be repaired, and may be reported as lost, or may be sent with the errors to the user.

Software applications that use memory devices assume that the information is correct until the correction system fails to repair the data. As long as the memory is still fully functional, there is no indication to the user that the memory is deteriorating and approaching failure. It should be noted that the error level is only one of several early-warning symptoms that can be used to predict the life expectancy of a memory prior to failure.

Today, users (and applications) are unaware of the state, or condition, of the stored data. Thus, users are unable to take active measures to reduce the risk of losing data. Such measures include, for example, creating a back-up of the data, migrating the data to new storage media, and rewriting problematic areas of the memory device to other areas.

The current state of the art does not provide a way to report the "health" (i.e. operational-reliability performance) of a memory device. While some prior art methods record the usage of the device (i.e. the number of times the device is written to) for internal load-balancing purposes, the methods are not designed for the purpose of providing an early-warning indication to a user or application. While there is a correlation between the usage of the device and the device's remaining life expectancy, such a correlation is not absolute since there is a natural, random variability among devices (similar to the inaccuracy of predicting a person's life expectancy based on age only).

Methods that attempt to monitor the health of a memory device are known in the art, but are limited to programs that run on the host system. Thus, these methods can only deal with the corrected information, after error-correction methods have been employed to correct the errors. An example of a prior art system is provided in a feature called "Disk Health" that is included in the "Norton System Doctor (NSD)" product available from Symantec Corp., Cupertino, Calif. (also described in Document ID: 2001082218352309, included in the NSD product manual, and found on the Norton web site, www.norton.com). The data is read from the memory device; therefore, the host system is not exposed to the raw data before the data has been corrected. This aspect makes such prior-art methods less sensitive to early stages of deterioration in the health of the memory device.

It would be desirable to give the user of such memory devices an early-warning indication when the health of the device deteriorates and approaches a high probability of failure.

It would be further desirable to have a system, operating according to a method, which resides on a memory device, and detects and reports the actual deterioration of indicative longevity parameters on the memory device before any attempt is made to correct the data. Such a system would be of significant importance for modern multi-level flash-memory devices in which the inherent life expectancy is shorter than in traditional single-level flash-memory devices, and in which the symptoms of aging can be measured without slowing the routine operation.

SUMMARY OF THE INVENTION

It is the purpose of the present invention to provide methods for built-in detection of the deterioration of reliability in digital memory devices in general, and in removable flash-memory devices in particular. The present invention describes flash-memory devices as a typical example, but is applicable to, and intended to cover, any memory device.

For the purpose of clarity, several terms which follow are specifically defined for use within the context of this application. The term "longevity parameter" is used in this application to refer to a variable of a memory device whose value changes during the life of the memory device, represents a relative deteriorated health of at least one cell of the memory device, and correlates with the device's life expectancy. Such parameters include, for example: the average number of errors, the number of programming cycles, and the number of bits that flipped logic state (upon the first programming pulse of a programming operation) when the bits are written to the memory.

The present invention applies to both single-level-cell (SLC) flash memories and multi-level-cell (MLC) flash memories. While the subsequent discussion focuses primarily on SLC cells, it will be clear to those skilled in the art how the present invention applies to MLC cells. The terms "erasing" and "writing" are used herein to refer to setting threshold voltages of a memory cell, where erasing typically sets the voltages to correspond to one-logic states, and writing typically sets the voltages to correspond to zero-logic states for SLC cells. The terms "writing" and "programming" are used interchangeably herein. The present invention is particularly applicable to NAND-type flash memories that are read and programmed a page at a time.

The term "block" is used in this application to refer to the smallest number of cells, in a memory, that can be erased in a single operation. The term "page" is used in this application to refer to the smallest number of cells, in a memory, that that can be written in a single operation. Typically, there are multiple pages in a block. The term "grade" is used in this application to refer to a measure of the reliability of a memory page or block based on the values of the page's or block's longevity parameters. It is noted that an erase-operation is typically performed on a block (as opposed to a page). Thus, in the context of erase-operations, the grade refers to a measure of the reliability of a block based on the block's longevity parameters.

The term "initial health" is used in this application to refer to a longevity parameter that represents the deviation of the grade of a page or block from some reference value. Blocks can start their "lives" with different initial healths. The term "relative deteriorated health" is used in this application to refer to the deterioration of the health of a block or page from an initial health since the block was produced and tested. The health of blocks can deteriorate at different rates. The term "healthy cells" is used in this application to refer to cells that have successfully changed logic states after a sequence of programming pulses associated with a data operation.

Furthermore, the term "memory device" is used in this application to refer to any non-volatile memory that stores data via a physical process that can result in errors. Such memory devices include portable and stationary devices, based on semiconductor, magnetic, holographic, optical, and other physical binary-logic memory-technologies.

FIG. 1 is a flowchart of the operational procedure for a typical write-operation of a SLC NAND-type flash-memory device. When a controller of the memory of a flash-memory device instructs the memory to write certain information to a page, the memory conducts a series of operations. The data is first written to a memory buffer (Block 10). Then, the destination of the write-operation data (i.e. the physical location in the memory, or "word line") is selected (Block 12). The programming step is divided into several short programming pulses. The first pulse is applied to program all bits that are to be programmed (Block 14). After each programming cycle, the programmed bits are checked to verify that the bits have met the threshold level (this level is higher than a standard read threshold-level) (Block 16). If not all of the bits are at the correct values (Block 18), an additional programming cycle is performed (Block 20). Optionally, the additional cycle may be performed with higher voltage (Block 20). When all of the bits match the buffer values, the program cycle (i.e. write-operation) is finished (Block 22).

Usually, the programming cycles utilize gradually increasing levels of voltage until the end of the write-operation. However, in some types of NAND-type flash-memory devices, the difference between the first and second pulses is much higher than the subsequent pulses. In such a case, an option to increase the voltage in small steps after a few initial large increments is utilized.

The process of selectively writing (i.e. programming) data to a flash memory involves changing logic states of selected memory cells, typically, in a SLC implementation, from one-logic to zero-logic. The process of selectively erasing data from a flash memory involves changing values of selected memory cells, typically from zero-logic to one-logic. However, this designation is arbitrary, and would be equally implementable in the opposite designation.

NAND-type flash memories have one or more page buffers (i.e. memory cells with read/write capability), which receive the data before the data is programmed into the flash memory cells. Page-programming methods, for flash memory in which each flash memory cell contains one bit of information and erased flash memory cells have one-logic, implement the following steps:

(1) Apply a programming voltage pulse only to flash memory cells that have zero-logic in the corresponding cells of the page buffer, where a programming voltage pulse is a single attempt to set a cell to the desired threshold voltage, typically many such pulses are required to achieve the required voltage level;

(2) Read the data programmed into the memory;

(3) Set the corresponding cells of the page buffer to one-logic for all flash memory cells that return zero-logic when read;

(4) Repeat steps 1-3 until all cells in the page buffer contain one-logic or until the number of pulses exceeds the maximum number allowed; and (5) If the number of pulses exceeds the maximum number allowed, then return a failure status for the page-programming operation.

The present invention includes several preferred embodiments in which the memory controller of a flash-memory device can detect symptoms of deterioration in the flash-memory device, and provide a reliable prediction of the life expectancy of the flash-memory device. A longevity parameter, derived from a grade, serves as a "forecast" of the life expectancy of the flash-memory device. A device having a poorer longevity parameter is indicative of a relatively shorter life expectancy than a device with a better longevity parameter.

In a preferred embodiment, the system monitors the probability of error in reading data from the flash memory. Usually, this statistic is available to the ECC of the flash-memory controller, and does not require any direct access to the flash memory itself. In some flash-memory devices, the ECC is built into the flash memory itself. In such devices, information about the number of errors is made available to the memory controller by a command.

In another preferred embodiment, the system monitors either the average or the maximum number of pulses required to change the state of a data bit during programming. In flash-memory devices, this number typically ranges from 4 to 25 programming pulses (depending on the type of flash memory). As the flash memory deteriorates, the number of pulses required to write the data to the flash memory increases.

In another preferred embodiment, the system monitors the number of successful changes of logic state of data bits after a given number of pulses. For example, the numbers of bits that are correctly programmed after the first pulse decreases with the deterioration of the flash memory as more bits require more than one pulse for writing.

Therefore, according to the present invention, there is provided for the first time a method for managing a memory device, the method including: (a) monitoring a value of a longevity parameter of the memory device after a data operation on the memory device, the monitoring being performed by the memory device; and (b) deriving a grade of the memory device from the value.

Preferably, the longevity parameter is a ratio of successfully-processed data to unsuccessfully-processed data.

Alternatively, the longevity parameter is a deviation in a power consumption of the memory device. Most preferably, the deviation is an average of measurements for a plurality of the operations.

Preferably, the grade serves as a forecast of a life expectancy of the memory.

Preferably, the operation is a programming operation, and the value is a number of programming pulses, associated with the operation, required to change logic states of at least one cell in a page of the memory device.

Preferably, the operation is an erase operation, and the value is a number of programming pulses, associated with the operation, required to change logic states of at least one cell in a block of the memory device.

Preferably, the operation is a programming operation, and the value is a number of healthy cells in a page of the memory device.

Preferably, the operation is an erase operation, and the value is a number of healthy cells in a block of the memory device.

Preferably, the operation is selected from the group consisting of: writing data, reading data, and erasing data.

Preferably, the grade is selected from the group consisting of: a comparison grade of a current value to a pre-determined reference value, a maximum grade of a plurality of the values stored in a monitoring device, and an average grade of the plurality of the values stored in the monitoring device.

Most preferably, if the grade is a comparison of a current value to a pre-determined reference value, the method further includes the step of: (c) storing the pre-determined reference value in the memory device upon manufacture of the memory device.

Preferably, the step of monitoring includes accessing the memory device for the purpose of deriving the grade.

Preferably, the method further includes the step of: (c) storing the grade in a monitoring device.

Most preferably, the monitoring device is selected from the group consisting of: the memory device, an embedded controller of the memory device, and a host system of the memory device.

Preferably, the step of deriving is initiated by the memory device.

Preferably, the step of deriving is initiated by a host system of the memory device.

Preferably, the step of deriving is initiated by an embedded controller of the memory device.

Preferably, the step of deriving is initiated by an application running on a host system.

Preferably, the step of deriving is initiated by an operating system running on a host system.

According to the present invention, there is provided for the first time a memory device for managing data, the device including: (a) a memory; and (b) a controller operative: (i) to monitor a value of a longevity parameter after a data operation on the memory; and (ii) to derive a grade of the memory device from the value.

Preferably, the grade serves as a forecast of a life expectancy of the memory device.

According to the present invention, there is provided for the first time a system for managing data, the system including: (a) a memory device including a memory; and (b) a processor, housed in said memory device, operative: (i) to monitor a value of a longevity parameter after a data operation on the memory; and (ii) to derive a grade of the memory device from the value.

Preferably, the grade serves as a forecast of a life expectancy of the memory device.

These and further embodiments will be apparent from the detailed description and examples that follow.

BRIEF DESCRIPTION OF THE DRAWINGS

The present invention is herein described, by way of example only, with reference to the accompanying drawings, wherein:

FIG. 4A is a simplified schematic diagram of the format of a typical data page, according to both the prior art and the present invention;

FIG. 4B is a simplified schematic diagram of the format of a data page that includes a grade of the page, according to a preferred embodiment of the present invention;

DESCRIPTION OF THE PREFERRED EMBODIMENTS

The present invention relates to methods for built-in detection of the deterioration of reliability in digital memory devices. The principles and operation for built-in detection of the deterioration of reliability in digital memory devices, according to the present invention, may be better understood with reference to the accompanying description and the drawings.

Figure 2:
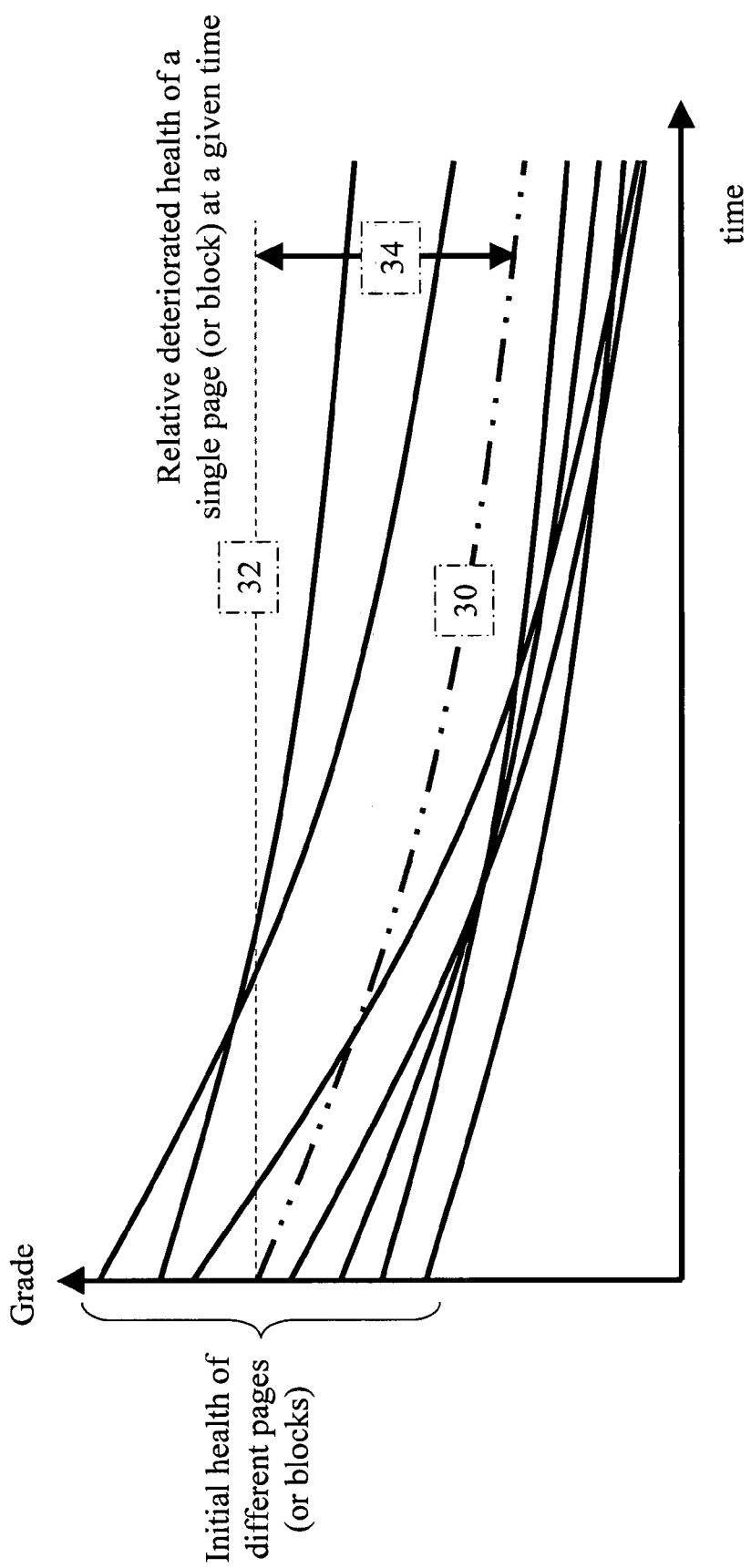
FIG. 2 shows a qualitative graph of the degradation of the grade of a data page (or block) of a memory device as a function of time, according to a preferred embodiment of the present invention.

Referring now to the drawings, FIG. 2 shows a qualitative graph of the degradation of the grade of a data page (or block) of a memory device as a function of time, according to a preferred embodiment of the present invention. As noted above, the grade may refer to a page or a block depending on the operation. The curves in FIG. 2 represent the respective grades of pages or blocks of a memory device. Consider one such curve 30. The initial health of the page/block of curve 30 is defined as the deviation of the initial grade of curve 30 (at t =0, i.e. at production/testing of the memory) from a reference grade value, shown as a line 32. The relative deteriorated health of the page/block of curve 30 at a given time is shown as a grade difference 34 from curve 30 to line 32.

Figures 3A, 3B:
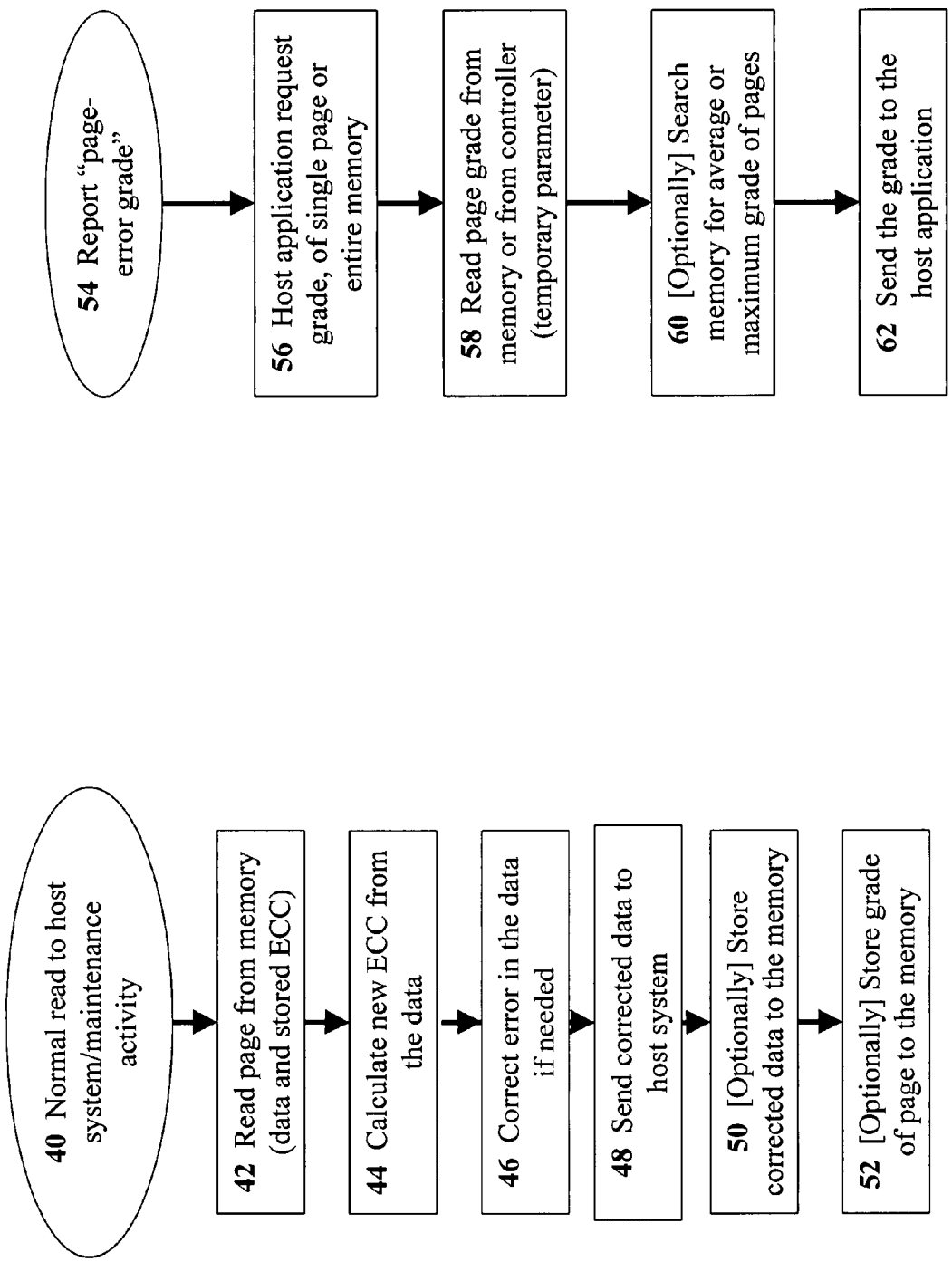
FIG. 3A is a flowchart of the operational procedure for a method for monitoring the number of errors that are discovered and fixed by a memory controller, according to a preferred embodiment of the present invention.
FIG. 3B is a flowchart of the operational procedure for a method for reporting the health of a memory device to a host system, according to a preferred embodiment of the present invention.

FIG. 3A is a flowchart of the operational procedure for a method for monitoring the number of errors that were discovered and fixed by a memory controller, according to a preferred embodiment of the present invention. Information is routinely read from the memory device, or access to the information is initiated by an application action or by an internal program running on the device's controller (e.g. an internal test or a regular maintenance procedure) (Block 40). While information is being read from the memory device, which includes reading the raw (i.e. originally-stored) data and any stored ECC information (Block 42), the information is checked for errors in the data (Block 44).

While the error detection/correction is employed, errors are fixed. The bits that do not match the raw data are calculated (Block 44) and repaired (Block 46). The number of repaired bits per page provides the controller with a measure of the reliability of the currently-read page. In the present embodiment, the number of repaired bits per page remains in the embedded controller (i.e. the controller embedded in the memory device), and only the corrected data is transferred to the application (Block 48). Optionally, in some ECC algorithms, the repaired data is rewritten by the controller to the memory (Block 50). Furthermore, the controller also optionally stores the number of error bits as the measure of reliability of the page, known as the grade, to the memory (Block 52).

FIG. 4A is a simplified schematic diagram of the format of a typical data page, according to both the prior art and the present invention. A page 70 typically has the ECC information, an ECC 72, stored next to the relevant data, information data 74. ECC 72 is usually based on a known error detection/correction method (e.g. Reed-Salomon or BCH algorithm). Such correction algorithms can fix data to a limited level (e.g. up to four error bits per 512-byte page).

FIG. 4B is a simplified schematic diagram of the format of a data page that includes a grade of the page, according to a preferred embodiment of the present invention. A page 76 has a grade 78 stored next to ECC 72 and information data 74. A typical report grade 78 is one error bit per 512-byte page. When grade 78 increases to a dangerous level (e.g. four error bits per 512-byte page) or exceeds a threshold, the application acts upon the information from grade 78 by initiating an action, even if information data 74 has been corrected. For example, the application can rewrite information data 74 to a different page, or report the deterioration, thereby enhancing the long-term reliability of information data 74.

Alternatively, a different type of grade reporting can be employed. FIG. 3B is a flowchart of the operational procedure for a method for reporting the health of a memory device to a host system, according to a preferred embodiment of the present invention. In the present embodiment, a "page-error grade" is stored in the controller, and reported to the application in response to a read-operation (Block 54). In response to a direct request from the application (Block 54), either a page grade or a dynamic (e.g. worst or average) grade found in the entire memory is reported. In the case of a dynamic grade representing a worst grade, this grade is updated each time the data is read if the number of errors exceeds the currently-stored grade, so that the grade shows the maximum number of errors detected for the page or for the entire memory device. In the case of a dynamic grade representing an average grade, this grade is updated each time the data is read. The grade read-operation (Block 54) includes the following steps. The host system requests either a particular page grade or a device grade (Block 56). The controller then reads the information from the information's stored location (e.g. memory, register, or embedded memory in the controller) (Block 58).

Optionally, if the action requires calculation of a grade based on the stored grade (e.g. an average or maximum of all pages based on the pages' individual grades), the controller performs this calculation (Block 60). The requested information (i.e. the grade) is then sent to the host application (Block 62).

Figure 1:
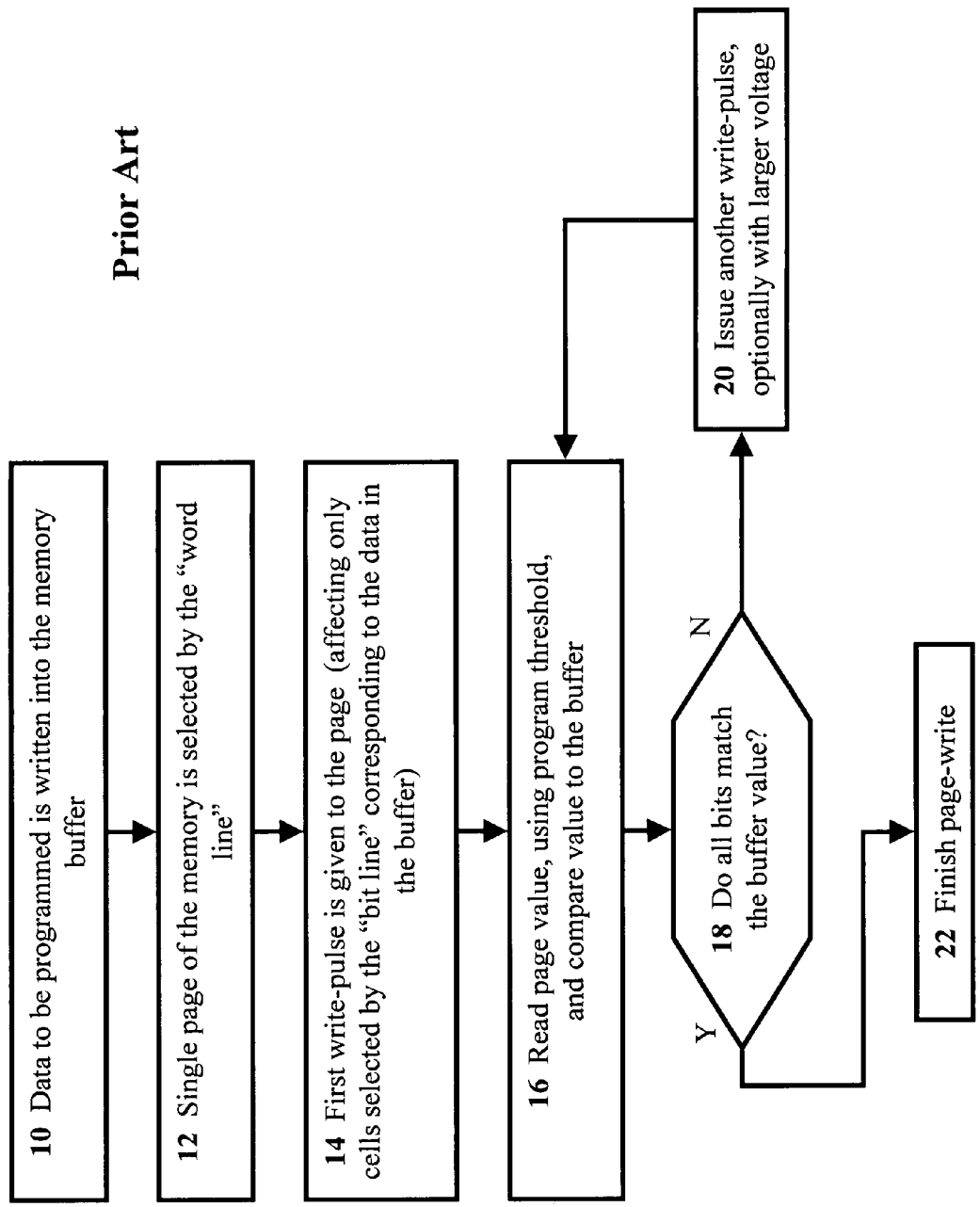
FIG. 1 is a flowchart of the operational procedure for a typical write-operation of a flash-memory device.
Figure 5:
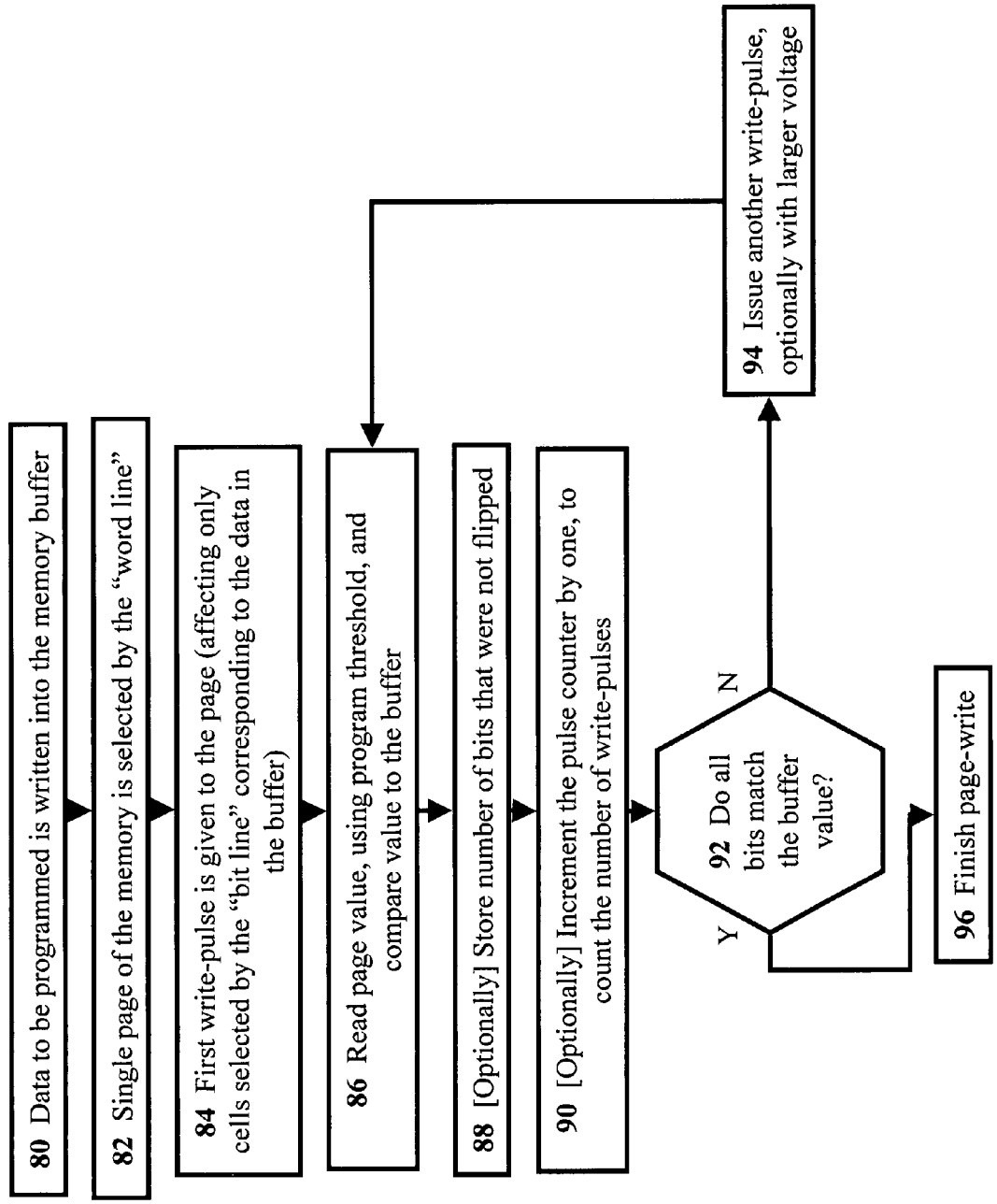
FIG. 5 is a flowchart of the operational procedure for a method for monitoring the number of pulses required for writing a page, and the number of bits that were flipped after a given number of pulses, according to a preferred embodiment of the present invention.

FIG. 5 is a flowchart of the operational procedure for a method for monitoring the number of pulses required for writing a page, and the number of bits that were flipped after a given number of pulses, according to a preferred embodiment of the present invention. In the present embodiment, the controller uses the number of pulses required to set all of the bits to the correct values as a measure of the page deterioration. The procedure outlined in FIG. 5 is similar to the procedure outlined in FIG. 1. The data is stored in the memory buffer (Block 80), then the physical location in the memory for the write-operation is selected (Block 82). The first pulse is applied to program all bits (Block 84). After each programming pulse, the data is read, and compared with the target data in the buffer (Block 86).

In a preferred embodiment, the number or percentage of bits in the page that are not successfully flipped by the first pulse or by any subsequent programming pulse (Block 88) is recorded. This number is used as an alternative measure of the memory aging or health. In another preferred embodiment, alternatively or additionally to the step of Block 88, an additional counter is used, and is incremented after each pulse (Block 90). The counter counts the number of program pulses in the program cycle. The number of pulses required to complete the programming is used as a measure of the memory aging or health.

After each programming cycle, the programmed bits are checked to verify that they have met the threshold level (this level is higher than a standard read threshold-level) (Block 92). If not all of the bits are at the correct values (Block 92), an additional programming cycle is performed (Block 94). Optionally, the additional cycle may be performed with higher voltage (Block 94). When all of the bits match the buffer values, the program cycle (i.e. write-operation) is finished (Block 96).

In a preferred embodiment of the present invention, the reported grade is a "block grade" (as opposed to a "page grade" ), and the information collected about the page grade from the read- and write-operations is used only to contribute information to the block grade for the specific block that contains the pages. As a result, the health is reported with a "block resolution" only.

In a preferred embodiment of the present invention, the reported grade represents a deviation in power consumption (from a reference or initial power consumption, for example) of the device. Such a grade indicates the efficiency of the device in executing the data operations. For example, a device which requires multiple programming pulses in order to perform an operation will consume more power than a device that can perform the operation with fewer pulses.

In a preferred embodiment of the present invention, a page that is not accessed for a given period of time, and therefore, the page's health has not been measured for a long period of time, is automatically read in background so that the aging of the page can be assessed.

In another preferred embodiment of the present invention, the aging of the device is evaluated by comparison of the measured health of the block/page to an original health after production (as stored in the original memory upon manufacture). This method compensates for inherent non-uniformity of the device, where some areas of the memory are produced with better health characteristics than other areas.

Figure 6A:
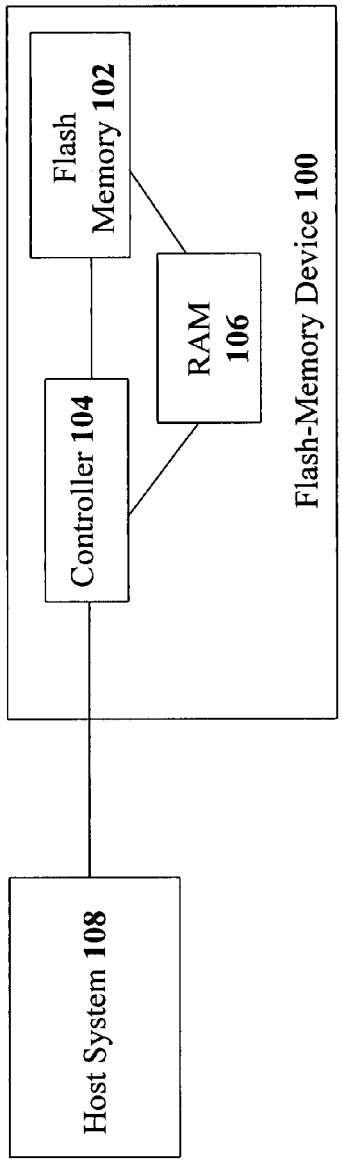
FIG. 6A is a high-level block diagram of a flash-memory device coupled to a host system, according to a-preferred embodiment of the present invention.

FIG. 6A is a high-level block diagram of a flash-memory device coupled to a host system, according to a preferred embodiment of the present invention. FIG. 6 is adapted from FIG. 1 of Ban, U.S. Pat. No. 5,404,485, which patent is incorporated by reference for all purposes as if fully set forth herein (hereinafter referred to as Ban '485). A flash-memory device 100 includes a flash memory 102, a controller 104, and a random-access memory (RAM) 106. Controller 104, which corresponds to "flash control 14" of Ban '485, manages flash memory 102, with the help of RAM 106, as described in Ban '485 and as described in U.S. Pat. No. 5,937,425, also to Ban, and hereinafter referred to as Ban '425, which patent also is incorporated by reference for all purposes as if fully set forth herein. Controller 104 also supports refreshing of the data that are stored in flash memory 102. Flash-memory device 100 is shown connected to a host system 108.

Figure 6B:
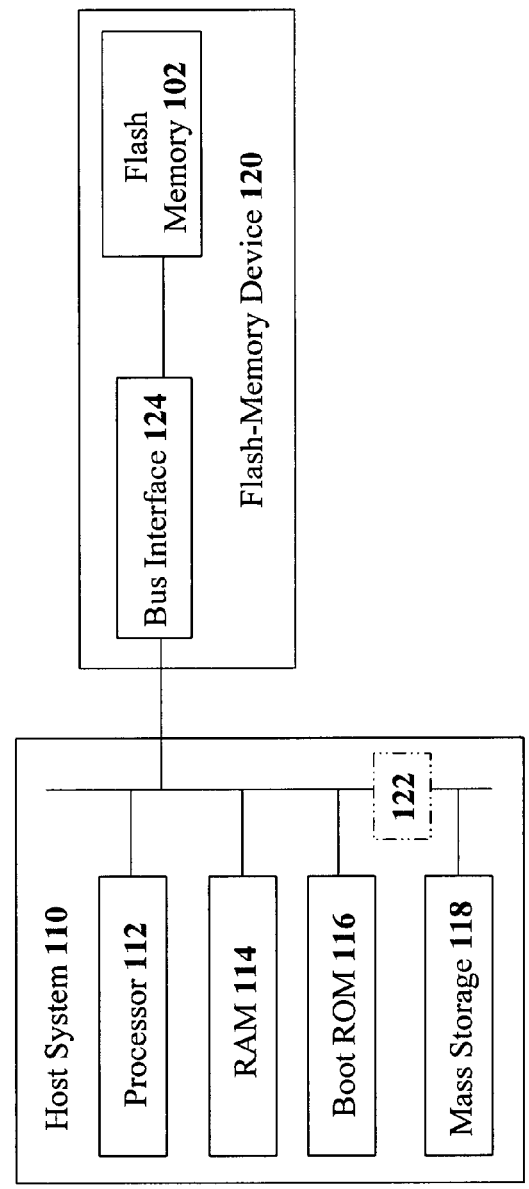
FIG. 6B is a high-level block diagram of an alternative flash-memory device coupled to a host system, according to a preferred embodiment of the present invention.

FIG. 6B is a high-level block diagram of an alternative flash-memory device coupled to a host system, according to a preferred embodiment of the present invention. Host system 110 includes a processor 112 and four memory devices: a RAM 114, a boot ROM 116, a mass-storage device (e.g. hard disk) 118 and a flash memory device 120, all communicating via a common bus 122. Like flash-memory device 100, flash-memory device 120 includes flash memory 102. Unlike flash-memory device 100, flash-memory device 120 lacks its controller and RAM. Instead, processor 112 emulates controller 104 by executing a software driver (not shown) that implements the methodology of Ban '485 and Ban '425 (e.g. in the manner of the TrueFFS™ driver of msystems Ltd. of Kefar Saba, Israel), and that also implements the grade-monitoring methodology of the present invention. Flash-memory device 120 also includes a bus interface 124 to enable processor 112 to communicate with flash memory 102.

While the invention has been described with respect to a limited number of embodiments, it will be appreciated that many variations, modifications, and other applications of the invention may be made.

What is claimed is:

1. A method for managing a memory device, the method comprising the steps of:
   (a) monitoring a value of a longevity parameter of the memory device after a programming operation on the memory device, said monitoring being performed by the memory device; and
   (b) deriving a grade of the memory device from said value; wherein said value is a number of programming pulses, associated with said operation, required to change logic states of at least one cell in a page of the memory device.

2. The method of claim 1, wherein said longevity parameter is a ratio of successfully-processed data to unsuccessfully-processed data.

3. The method of claim 1, wherein said longevity parameter is a deviation in a power consumption of the memory device.

4. The method of claim 1, wherein said deviation is an average of measurements for a plurality of said operations.

5. The method of claim 1, wherein said grade serves as a forecast of a life expectancy of said memory.

6. The method of claim 1, wherein said operation is a programming operation, and wherein said value is a number of healthy cells in a page of the memory device.

7. The method of claim 1, wherein said operation is an erase operation, and wherein said value is a number of healthy cells in a block of the memory device.

8. The method of claim 1, wherein said operation is selected from the group consisting of: writing data, reading data, and erasing data.

9. The method of claim 1, wherein said grade is selected from the group consisting of: a comparison grade of a current said value to a pre-determined reference said value, a maximum grade of a plurality of said values stored in a monitoring device, and an average grade of said plurality of said values stored in said monitoring device.

10. The method of claim 1, wherein said grade is a comparison grade of a current value to a pre-determined reference value, the method further comprising the step of:
    (c) storing said pre-determined reference value in the memory device upon manufacture of the memory device.

11. The method of claim 1, wherein said step of monitoring includes accessing the memory device for the purpose of deriving said grade.

12. The method of claim 1, the method further comprising the step of:
    (c) storing said grade in a monitoring device.

13. The method of claim 12, wherein said monitoring device is selected from the group consisting of: the memory device, an embedded controller of the memory device, and a host system of the memory device.

14. The method of claim 1, wherein said step of deriving is initiated by the memory device.

15. The method of claim 1, wherein said step of deriving is initiated by a host system of the memory device.

16. The method of claim 1, wherein said step of deriving is initiated by an embedded controller of the memory device.

17. The method of claim 1, wherein said step of deriving is initiated by an application running on a host system.

18. The method of claim 1, wherein said step of deriving is initiated by an operating system running on a host system.

19. A memory device for managing data, the device comprising:
    (a) a memory; and
    (b) a controller operative:
        (i) to monitor a value of a longevity parameter after a programming operation on said memory; and
        (ii) to derive a grade of the memory device from said value;
    wherein said value is a number of programming pulses associated with said operation required to change logic states of at least one cell in a page of the memory device.

20. The memory device of claim 19, wherein said grade serves as a forecast of a life expectancy of the memory device.

21. A system for managing data, the system comprising:
    (a) a memory device including a memory; and
    (b) a processor, housed in said memory device, operative:
        (i) to monitor a value of a longevity parameter after a programming operation on said memory; and
        (ii) to derive a grade of said memory device from said value;
    wherein said value is a number of programming pulses, associated with said operation, required to change logic states of at least one cell in a page of the memory device.

22. The system of claim 21, wherein said grade serves as a forecast of a life expectancy of said memory device.

23. A method for managing a memory device, the method comprising the steps of:
    (a) monitoring a value of a longevity parameter of the memory device after an erase operation on the memory device, said monitoring being performed by the memory device; and
    (b) deriving a grade of the memory device from said value; wherein said value is a number of programming pulses, associated with said operation, required to change logic states of at least one cell in a block of the memory device.

24. A memory device for managing data, the device comprising:
    (a) a memory; and
    (b) a controller operative:
        (i) to monitor a value of a longevity parameter after an erase operation on said memory; and
        (ii) to derive a grade of the memory device from said value;
    wherein said value is a number of programming pulses, associated with said operation, required to change logic states of at least one cell in a block of the memory device.

25. A system for managing data, the system comprising:
    (a) a memory device including a memory; and
    (b) a processor, housed in said memory device, operative:
        (i) to monitor a value of a longevity parameter after an erase operation on said memory; and
        (ii) to derive a grade of said memory device from said value;

wherein said value is a number of programming pulses, associated with said operation, required to change logic states of at least one cell in a block of the memory device.

26. A method for managing a memory device, the method comprising the steps of:
   (a) monitoring a value of a deviation in a power consumption of the memory device after a data operation on the memory device, said monitoring being performed by the memory device; and
   (b) deriving a grade of the memory device from said value.

27. The method of claim 26, wherein the memory device is a flash memory device.

28. A memory device for managing data, the device comprising:
   (a) a memory; and
   (b) a controller operative:
      (i) to monitor a value of a deviation in a power consumption of the memory device after a data operation on said memory; and
      (ii) to derive a grade of the memory device from said value.

29. The method of claim 28, wherein said memory is a flash memory.

30. A system for managing data, the system comprising:
   (a) a memory device including a memory; and
   (b) a processor, housed in said memory device, operative:
      (i) to monitor a value of a deviation in a power consumption of the memory device after a data operation on said memory; and
      (ii) to derive a grade of said memory device from said value.

31. The method of claim 30, wherein said memory device is a flash memory device.

32. A method for managing a memory device, the method comprising the steps of:
   (a) monitoring a number of healthy cells in a block of the memory device after an erase operation on the memory device, said monitoring being performed by the memory device; and
   (b) deriving a grade of the memory device from said value.

33. A memory device for managing data, the device comprising:
   (a) a memory; and
   (b) a controller operative:
      (i) to monitor a number of healthy cells in a block of said memory after an erase operation on said memory; and
      (ii) to derive a grade of the memory device from said value.

34. A system for managing data, the system comprising:
   (a) a memory device including a memory; and
   (b) a processor, housed in said memory device, operative:
      (i) to monitor a number of healthy cells in a block of said memory after an erase operation on said memory; and
      (ii) to derive a grade of said memory device from said value.

* * * * *